(12) United States Patent
Kamata et al.

(10) Patent No.: US 7,569,327 B2
(45) Date of Patent: Aug. 4, 2009

(54) CURABLE POLYMER COMPOUND

(75) Inventors: Hirotoshi Kamata, Kawasaki (JP); Keisuke Ohta, Oita (JP); Kazufumi Kai, Oita (JP)

(73) Assignee: Showda Denko K.K., Tokyo (JP)

( * ) Notice: Subject to any disclaimer, the term of this patent is extended or adjusted under 35 U.S.C. 154(b) by 807 days.

(21) Appl. No.: 10/557,173

(22) PCT Filed: May 25, 2004

(86) PCT No.: PCT/JP2004/007471

§ 371 (c)(1), (2), (4) Date: Nov. 17, 2005

(87) PCT Pub. No.: WO2004/106431

PCT Pub. Date: Dec. 9, 2004

(65) Prior Publication Data

US 2007/0021571 A1    Jan. 25, 2007

Related U.S. Application Data

(60) Provisional application No. 60/478,344, filed on Jun. 16, 2003.

(30) Foreign Application Priority Data

May 28, 2003   (JP)   ............................. 2003-151215

(51) Int. Cl.
   C08L 71/02   (2006.01)
   C08F 20/00   (2006.01)
   G03F 7/038   (2006.01)

(52) U.S. Cl. .................... 430/285.1; 522/142; 522/100; 525/286; 525/301; 430/7; 430/18; 430/287.1; 430/311; 430/325

(58) Field of Classification Search ................. 522/142, 522/100
   See application file for complete search history.

(56) References Cited

U.S. PATENT DOCUMENTS

2003/0060563 A1 *   3/2003   Kai et al. ...................... 525/41

FOREIGN PATENT DOCUMENTS

WO   WO 03/010124 A1   2/2003

OTHER PUBLICATIONS

Database WPI Section CH, Week 199545, Derwent Publications Ltd., London, GB; AN 1995-348368, XP002307270 for JP-A-7-238122 (Sep. 12, 1995).
Database WPI Section CH, Week 198347, Derwent Publications Ltd., London, GB; AN 1983-824023, XP002307271 for JP-A-58-176209 (Oct. 15, 1983).
Database WPI Section CH, Week 198617, Derwent Publications Ltd., London, GB; AN 1986-109283, XP002307272 for JP-A-61-51030 (Mar. 13, 1986).

* cited by examiner

*Primary Examiner*—Randy Gulakowski
*Assistant Examiner*—Brieann R Fink
(74) *Attorney, Agent, or Firm*—Sughrue Mion, PLLC

(57) ABSTRACT

This invention relates to a novel polymer compound, and a process for preparing the same and a radical polymerizable, curable composition using the same. The polymer of the invention has in the side chain thereof a structure represented by the formula (1): wherein R1 each independently represents at least one or more organic residue selected from the group consisting of an alkylene group, a branched alkylene group, a cycloalkylene group, an aralkylene group and an arylene group, R2 each independently represents at least one or more organic residue selected from the group consisting of an alkylene group, a branched alkylene group, an alkenylene group, a branched alkenylene group, a cycloalkylene group, a cycloalkenylene group and an arylene group, and n represents an integer of 0 to 20.

$$-O-CH_2-CH-CH_2-O-\overset{O}{\underset{\|}{C}}-CH=CH-\overset{O}{\underset{\|}{C}}-O+R^1-O\underset{n}{\overset{}{+}}-CH_2-CH=CH_2$$

with side group: $-O-\overset{O}{\underset{\|}{C}}-R^2-\overset{O}{\underset{\|}{C}}-OH$ (1)

30 Claims, 4 Drawing Sheets

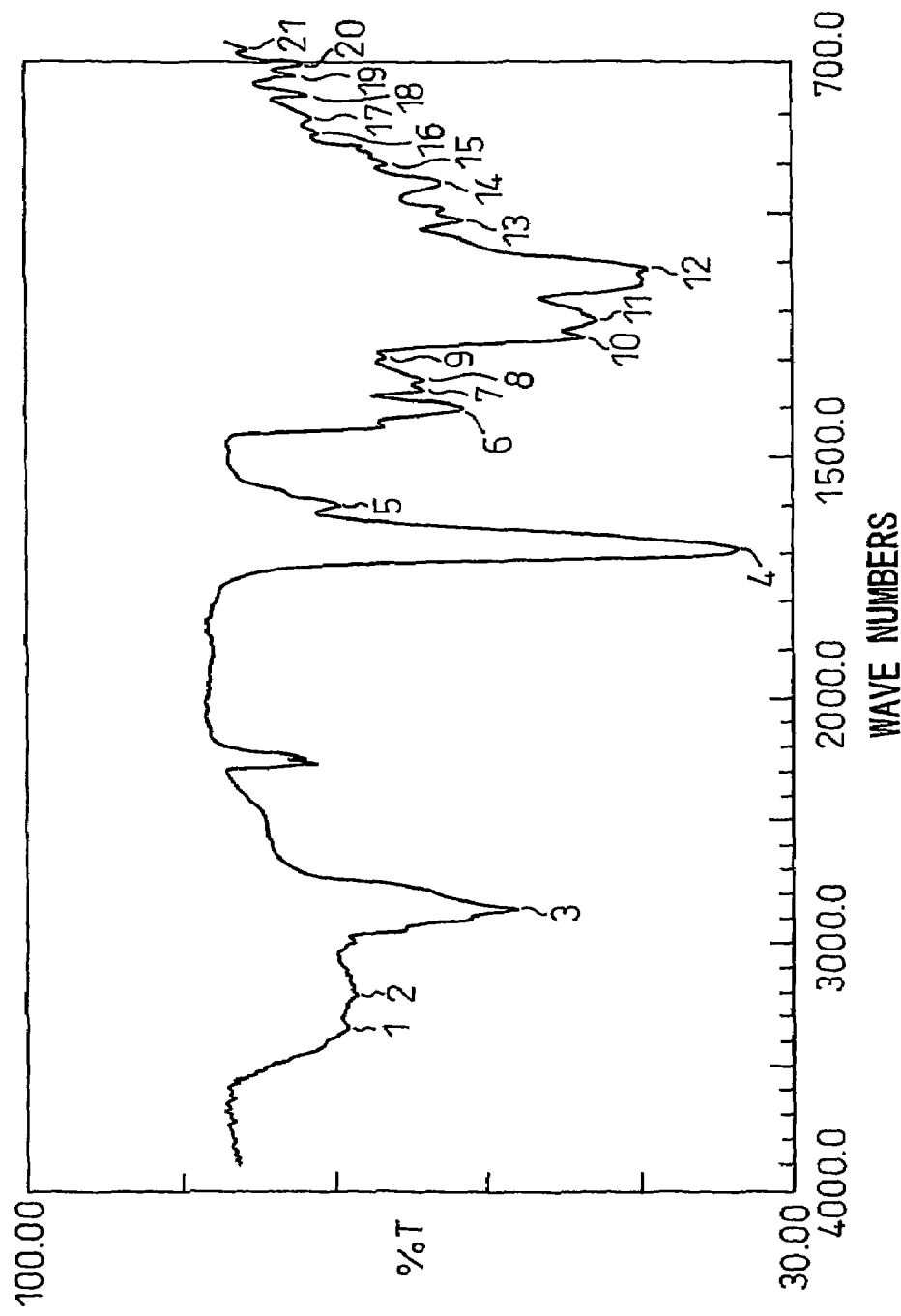

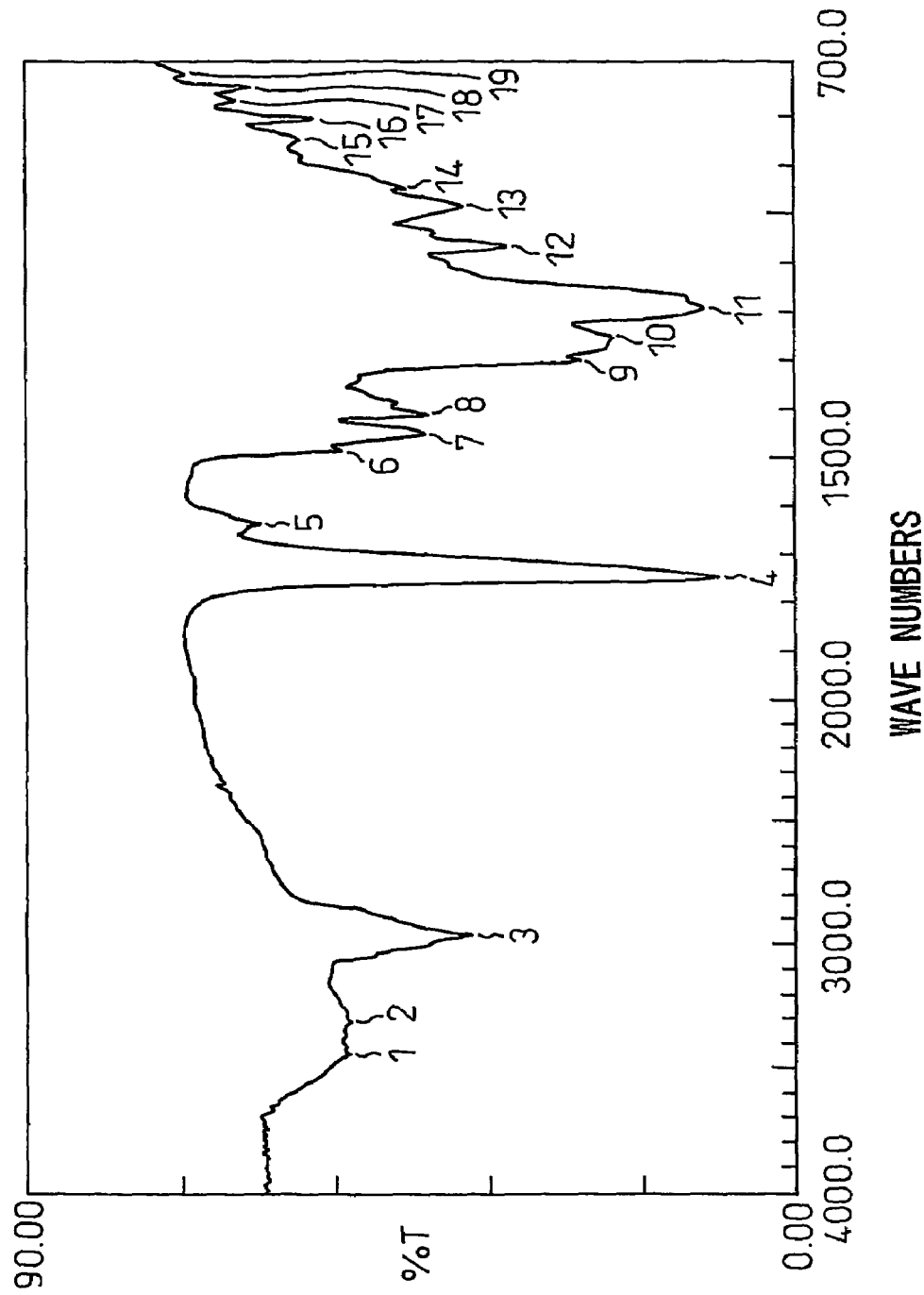

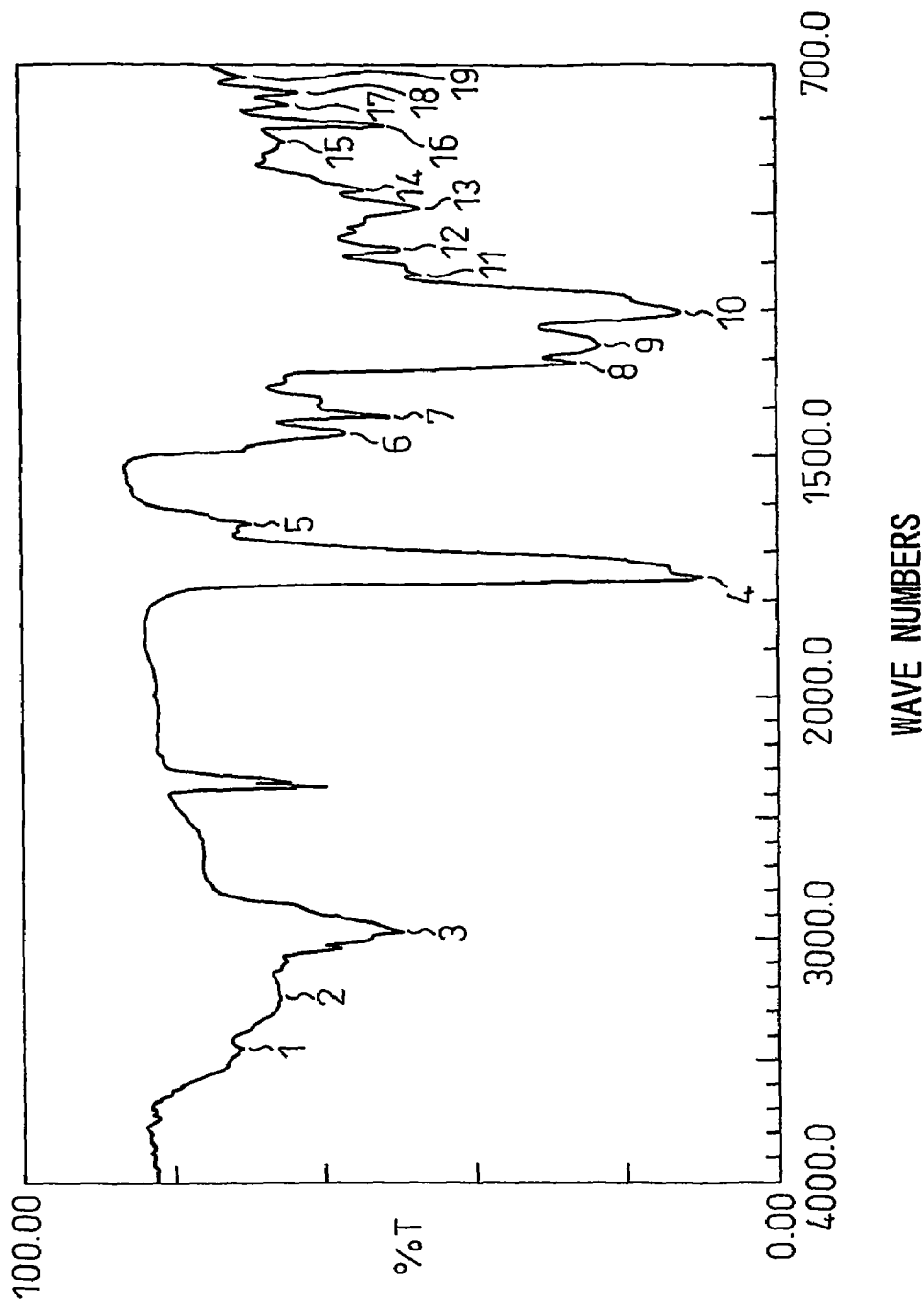

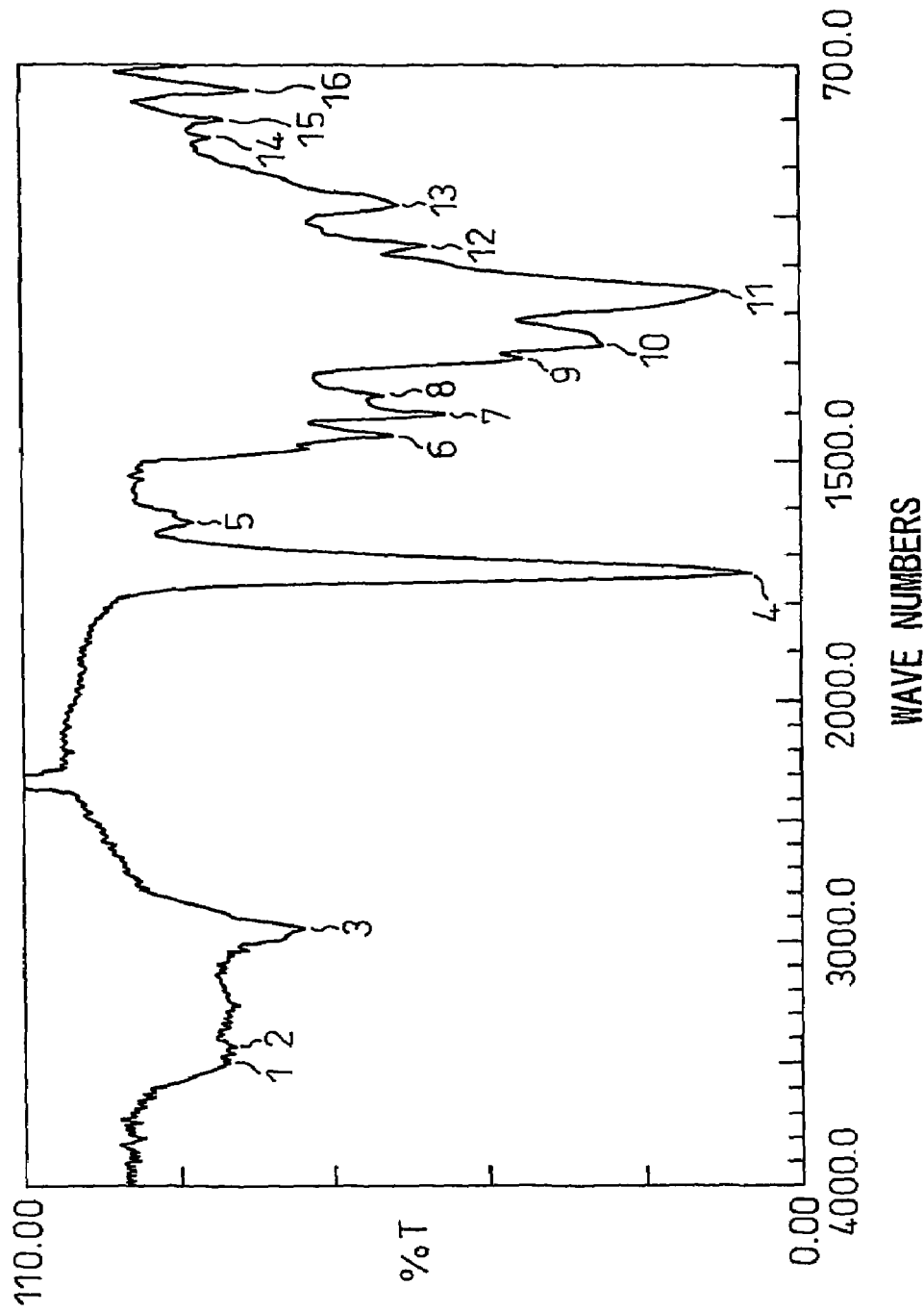

CURABLE POLYMER COMPOUND

CROSS-REFERENCES TO RELATED APPLICATIONS

This application claims benefit under 35 U.S.C. §119(e) to U.S. Provisional Application Ser. No. 60/478,344, filed Jun. 16, 2003.

FIELD OF THE INVENTION

The present invention relates to a novel polymer compound, a production process of the polymer compound, a radical polymerizable•curable composition using the polymer compound, and a cured product obtained by photocuring the radical polymerizable•curable composition.

More specifically, the present invention relates to a curable polymer composition having a pattern-forming property, where a radical polymerizable group is imparted to enable curing by light and at the same time, a carboxyl group is introduced to impart developability with an aqueous alkali solution, and also relates to a production process of the polymer compound and a radical polymerizable•curable composition using the polymer compound.

BACKGROUND OF THE INVENTION

In recent years, from the standpoint of saving resources and energy, a photocurable resin capable of being cured by light energy such as ultraviolet ray or electron beam is being widely used in the field of printing, coating material and adhesive.

Particularly, in view of productivity, a radical polymerizable•curable resin capable of being cured by ultraviolet ray has been suitably used for the preparation of an etching resist for forming a circuit used in the field of electronic device, a solder resist for protecting a circuit board over a long period of time, a color filter resist for producing individual picture elements of a color filter, or a black matrix resist used in a color filter for dividing respective picture elements and enhancing the contrast.

Examples of such a resin include an epoxy acrylate resin described in *Polyester Jushi Handbook* (*Polyester Resin Handbook*), pp. 353-355, Nikkan Kogyo Shinbun Sha (1988), a resin obtained by adding an acrylic acid to a glycidyl methacrylate copolymer described in Japanese Unexamined Patent Publication (Kokai) No. 2001-89553 and then adding a polybasic acid anhydride to the produced hydroxyl group, and a resin obtained by adding a (meth)acrylate compound having an epoxy group to a carboxyl group in the side chain of an acryl-based or styrene-based copolymer described in Kokai Nos. 10-253815 and 10-253816.

However, these resins have a problem in that since the radical polymerizable group is a (meth)acryloyl group, the coating film surface is susceptible to radical polymerization inhibition by oxygen and liable to remain sticky and a sufficiently high photosensitivity cannot be obtained.

In order to solve this problem, a method of adding a photo-radical polymerization initiator in a large amount is generally employed, but this has a problem such that depending on the kind of the photo-radical polymerization initiator, a precipitate originated in the photo-radical polymerization initiator is generated in an alkali developing tank to contaminate the alkali developing tank, or the remaining photo-radical polymerization initiator sublimates at the post-curing of the resist to contaminate a heating furnace or an exhaust duct.

In the present invention, the "(meth)acryl" means "methacryl" and/or "acryl". The same applies to the "(meth)acryloyl" and the like.

With respect to the method for preventing the polymerization inhibition by oxygen, a method of performing the curing and crosslinking by using a thiyl radical which is less susceptible to inhibition by oxygen, for example, a method of adding a polyfunctional thiol (Kokai Nos. 10-253815, 10-253816 and 2000-249822), has been studied. However, this method is disadvantageous in that a mercapto group and a (meth)acryloyl group are reacted by the Michel addition during storage and therefore, the storage stability is bad.

Also, introduction or the like of an allyl ether group are being attempted. For example, in Japanese Examined Patent Publication (Kokoku) No. 1-51487, a trimethylolpropane diallylether reactant of phthalic anhydride and methacrylic acid are reacted with an epoxy resin to introduce an allyl group and thereby avoid the polymerization inhibition by oxygen. However, the allyl ether group is poor in the radial polymerizability and this method is insufficient in view of the polymerization rate.

Under these circumstances, a curable polymer compound improved in the radical polymerization inhibition by oxygen, and a radical polymerizable•curable composition containing the compound are being demanded.

An object of the present invention is to solve those problems and provide a novel polymer compound extremely insusceptible to polymerization inhibition by oxygen and particularly, curable by light. The object of the present invention includes providing a production process of the radical polymerizable resin and a radical polymerizable•curable composition using the radical polymerizable resin.

As result of intensive investigations to attain the above-described object, the present inventors have found that when a polymer compound having an epoxy group, particularly, a novel polymer compound obtained by using a (meth)acrylic acid ester copolymer having an epoxy group, a fumaric acid monoester having an allyl group and depending on the case, further a (meth)acrylic acid as raw materials and reacting these, is used, a radical polymerizable•curable composition insusceptible to polymerization inhibition by oxygen and particularly, capable of being swiftly cured by light can be provided. The present invention has been accomplished based on this finding.

SUMMARY OF THE INVENTION

That is, the present invention provides a polymer compound described in [1]-[4] and [16]-[19] below, a production process thereof described in [5]-[10] and [20]-[25] below, a radical polymerizable•curable composition using the compound, described in [11]-[14] and [26]-[29] below, and a photocured product obtained by using the composition, described in [15] and [30] below.

[1] A polymer compound having in the side chain thereof a structure represented by the following formula (1):

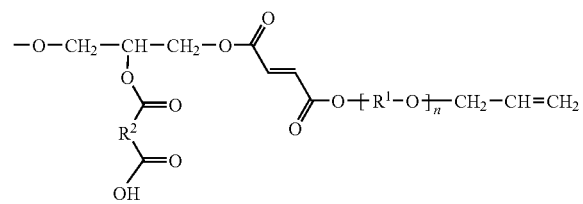

herein $R^1$ each independently represents at least one or more organic residue selected from the group consisting of an alkylene group, a branched alkylene group, a cycloalkylene group, an aralkylene group and an arylene group, $R^2$ each independently represents at least one or more organic residue selected from the group consisting of an alkylene group, a branched alkylene group, an alkenylene group, a branched alkenylene group, a cycloalkylene group, a cycloalkenylene group and an arylene group, and n represents an integer of 0 to 20.

[2] The polymer compound as described in [1], wherein the polymer compound residue working out to the main chain is a (meth)acrylic acid ester copolymer.

[3] The polymer compound as described in [1], wherein in formula (1), $R^1$ has a structure represented by the following formula:

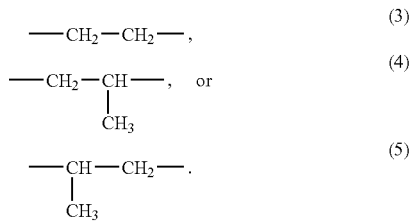

[4] The polymer compound as described in [1], wherein $R^2$ has a structure represented by the following formula:

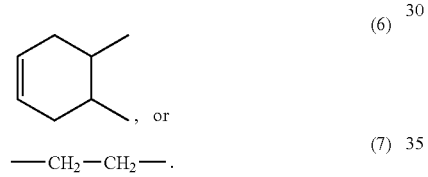

[5] A process for producing the polymer compound described in [1], comprising the following steps:

Production Step A1:

a production step of performing an addition reaction of adding to a polymer compound represented by the following formula (8):

wherein $R^4$ represents a polymer compound residue, and m represents an integer of 2 or more, at least one or more compound represented by the following formula (9):

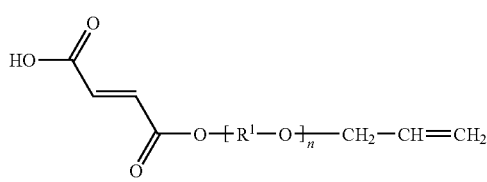

wherein $R^1$ each independently represents at least one or more organic residue selected from the group consisting of an alkylene group, a branched alkylene group, a cycloalkylene group, an aralkylene group and an arylene group, and n represents an integer of 0 to 20; and Production Step A2:

a production step of further adding to the polymer compound having a hydroxyl group obtained in Production Step A1, at least one or more polybasic acid anhydride represented by the following formula (10):

wherein $R^2$ each independently represents at least one or more organic residue selected from the group consisting of an alkylene group, a branched alkylene group, an alkenylene group, a branched alkenylene group, a cycloalkylene group, a cycloalkenylene group and an arylene group, to obtain the polymer compound described in [1].

[6] The process as described in [5], wherein in formula (9), $R^1$ has a structure represented by the following formula:

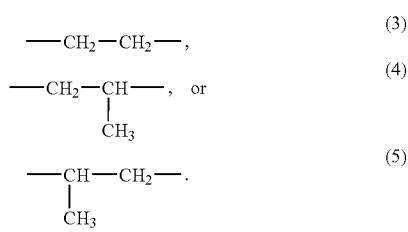

[7] The process as described in [5], wherein in formula (10), $R^2$ has at least one structure represented by the following formula:

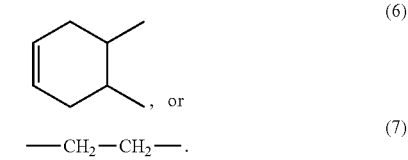

[8] The process as described in [5], wherein the addition reaction of Production Step A1 is performed in the presence of a catalyst.

[9] The process as described in [8], wherein the catalyst contains at least one or more catalyst selected from the group consisting of a metal halide, a tertiary amine, a pyridine-based compound, a pyridinium salt, a quaternary ammonium salt, a phosphine-based compound and a phosphonium salt.

[10] The process as described in [9], wherein the catalyst contains at least one or more catalyst selected from the group consisting of benzyltrimethylammonium chloride, benzyltriethylammonium chloride, tetrabutylammonium bromide, triphenylphosphine, ethyltriphenylphosphonium bromide, tetraphenylphosphonium bromide and benzyltriphenylphosphonium chloride.

[11] A radical polymerizable•curable composition comprising the polymer compound described in [1].

[12] The composition as described in [11], which comprises from 1 to 99 mass % of the polymer compound described in [1] and from 1 to 99 mass % of an ethylenically unsaturated compound.

[13] A radical polymerizable•curable composition comprising from 0.1 to 40 parts by mass of a radical polymerization initiator per 100 parts by mass of the composition described in [11].

[14] The composition as described in [13], wherein the radical polymerization initiator is a photo-radical polymerization initiator.

[15] A photocured product having a pattern obtained by coating the composition described in [14] on a substrate, exposing and curing the composition through a photomask, and washing out the uncured portion with an aqueous alkali solution.

[16] A polymer compound having in the side chain thereof both a structure represented by the following formula (1):

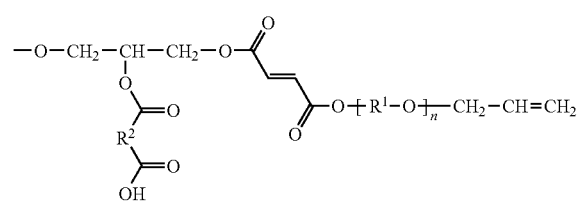

wherein $R^1$ each independently represents at least one or more organic residue selected from the group consisting of an alkylene group, a branched alkylene group, a cycloalkylene group, an aralkylene group and an arylene group, $R^2$ each independently represents at least one or more organic residue selected from the group consisting of an alkylene group, a branched alkylene group, an alkenylene group, a branched alkenylene group, a cycloalkylene group, a cycloalkenylene group and an arylene group, and n represents an integer of 0 to 20 and a structure represented by the following formula (2):

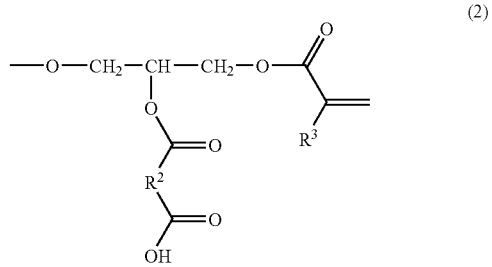

wherein $R^2$ each independently represents at least one or more organic residue selected from the group consisting of an alkylene group, a branched alkylene group, an alkenylene group, a branched alkenylene group, a cycloalkylene group, a cycloalkenylene group and an arylene group, and $R^3$ represents a hydrogen atom or a methyl group.

[17] The polymer compound as described in [16], wherein the polymer compound residue working out to the main chain is a (meth)acrylic acid ester copolymer.

[18] The polymer compound as described in [16], wherein in formula (1), $R^1$ has a structure represented by the following formula:

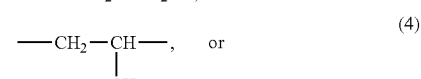

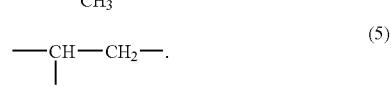

[19] The polymer compound as described in [6], wherein in formula (1) or (2), $R^2$ has a structure represented by the following formula:

[20] A process for producing the polymer compound described in [16], comprising the following production steps:

Production Step B1:

a production step of performing an addition reaction of adding to a polymer compound represented by the following formula (8):

wherein $R^4$ represents a polymer compound residue, and m represents an integer of 2 or more, at least one or more compound represented by the following formula (9):

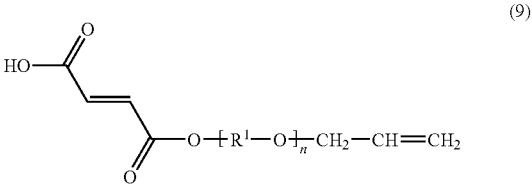

wherein $R^1$ each independently represents at least one or more organic residue selected from the group consisting of an alkylene group, a branched alkylene group, a cycloalkylene group, an aralkylene group and an arylene group, and n represents an integer of 0 to 20 and at least one or more compound represented by the following formula (11):

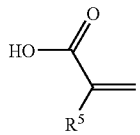

(11)

wherein $R^5$ represents a hydrogen atom or a methyl group; and

Production Step B2:

a production step of further adding to the polymer compound having a hydroxyl group obtained in Production Step B1, at least one or more polybasic acid anhydride represented by the following formula (10):

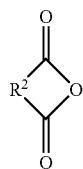

(10)

wherein $R^2$ each independently represents at least one or more organic residue selected from the group consisting of an alkylene group, a branched alkylene group, an alkenylene group, a branched alkenylene group, a cycloalkylene group, a cycloalkenylene group and an arylene group to obtain the polymer compound described in [16].

[21] The process as described in [20], wherein in formula (9), $R^1$ has a structure represented by the following formula:

—CH$_2$—CH$_2$—, (3)

—CH$_2$—CH—, or (4)
      |
     CH$_3$

—CH—CH$_2$—. (5)
 |
CH$_3$

[22] The process as described in [20], wherein in formula (10), $R^2$ has at least one structure represented by the following formula:

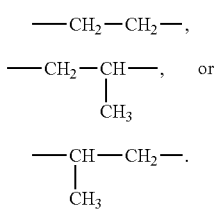, or (6)

—CH$_2$—CH$_2$—. (7)

[23] The process as described in [20], wherein the addition reaction of Production Step B1 is performed in the presence of a catalyst.

[24] The process as described in [23], wherein the catalyst contains at least one or more catalyst selected from the group consisting of a metal halide, a tertiary amine, a pyridine-based compound, a pyridinium salt, a quaternary ammonium salt, a phosphine-based compound and a phosphonium salt.

[25] The process as described in [24], wherein the catalyst contains at least one or more catalyst selected from the group consisting of benzyltrimethylammonium chloride, benzyltriethylammonium chloride, tetrabutylammonium bromide, triphenylphosphine, ethyltriphenylphosphonium bromide, tetraphenylphosphonium bromide and benzyltriphenylphosphonium chloride.

[26] A radical polymerizable•curable composition comprising the polymer compound described in [16].

[27] The composition as described in [26], which comprises from 1 to 99 mass % of the polymer compound described in [16] and from 1 to 99 mass % of an ethylenically unsaturated compound.

[28] A radical polymerizable•curable composition comprising from 0.1 to 40 parts by mass of a radical polymerization initiator per 100 parts by mass of the composition described in [26].

[29] The composition as described in [28], wherein the radical polymerization initiator is a photo-radical polymerization initiator.

[30] A photocured product having a pattern obtained by coating the composition described in [29] on a substrate, exposing and curing the composition through a photomask, and washing out the uncured portion with an aqueous alkali solution.

BRIEF DESCRIPTION OF THE DRAWINGS

FIG. 1 is an IR spectrum diagram of Sample A.
FIG. 2 is an IR spectrum diagram of Sample B.
FIG. 3 is an IR spectrum diagram of Sample C.
FIG. 4 is an IR spectrum diagram of Sample D.

DETAILED DESCRIPTION OF THE INVENTION

The mode for carrying out the present invention is described below.

1. Polymer Compound

The curable polymer compound of the present invention is characterized by having in the side chain thereof a structure represented by the following formula (1):

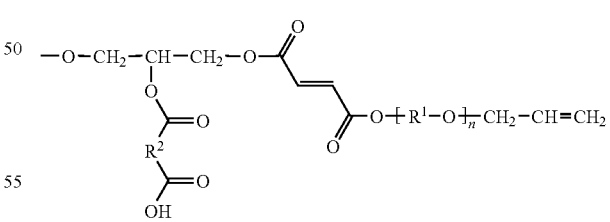

(1)

wherein $R^1$ each independently represents at least one or more organic residue selected from the group consisting of an alkylene group, a branched alkylene group, a cycloalkylene group, an aralkylene group and an arylene group, $R^2$ each independently represents at least one or more organic residue selected from the group consisting of an alkylene group, a branched alkylene group, an alkenylene group, a branched alkenylene group, a cycloalkylene group, a cycloalkenylene group and an arylene group, and n represents an integer of 0 to 20. The "side chain" as used in the present invention indicates a branched portion directly or indirectly bonded to a linear polymer constituting the main chain and contains a partial structure represented by formula (1) or by the following formula (2):

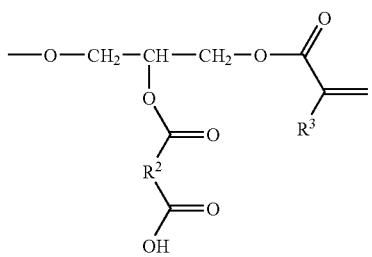

(2)

wherein $R^2$ each independently represents at least one or more organic residue selected from the group consisting of an alkylene group, a branched alkylene group, an alkenylene group, a branched alkenylene group, a cycloalkylene group, a cycloalkenylene group and an arylene group, and $R^3$ represents a hydrogen atom or a methyl group. In the curable polymer compound of the present invention, a plurality of partial structures represented by formula (1) or (2) may be present as the side chain and in this case, $R^1$s, $R^2$s or n's may be the same or different among the structures of formula (1) or (2). The curable polymer compound of the present invention may have, as the side chain, a structure other than the partial structure of formula (1) or (2).

The side chain of formula (1) in the curable polymer compound of the present invention has an allyl group and a fumaric acid-originated ethylenically unsaturated group at a ratio of 1:1. The allyl group and the fumaric acid-originated ethylenically unsaturated group are very high in the radical copolymerizability and polymerization inhibition by oxygen less occurs, so that polymerization can be efficiently performed with a small amount of a photo-radical polymerization initiator in the presence of oxygen. When a (meth)acryloyl group is further present together in the side chain, the polymerization rate can be more increased.

The polymer compound of the present invention further has a carboxyl group in the side chain. The carboxyl group is introduced for the purpose of imparting alkali developability to the polymer compound of the present invention.

In formula (1), $R^1$ is preferably an alkylene, branched alkylene, cycloalkylene, aralkylene or arylene group having from 1 to 20 carbon atoms, more preferably an alkylene or branched alkylene group having from 1 to 10 carbon atoms.

Specific examples of $R^1$ in formula (1) include linear alkylene groups such as methylene group, ethylene group, propylene group, butylene group, pentylene group, hexylene group, heptylene group, octylene group, nonylene group and decylene group, cycloalkylene groups such as cyclopropylene group, cyclobutylene group, cyclopentylene group, cyclohexylene group, cycloheptylene group, cyclooctylene group, dicyclopentylene group and tricyclopentylene group, branched alkylene groups such as methylethylene group, aralkylene groups such as phenylethylene group and 1,2-diphenylethylene group, and arylene groups such as phenylene group, naphthylene group and anthranylene group. However, the present invention is of course not limited to these specific examples.

Among these, in view of availability of raw materials and easiness of synthesis, preferred are the following formulae (3) to (5):

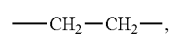

(3)

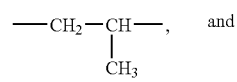

(4)

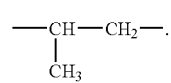

(5)

In formulae (1) and (2), $R^2$ represents an organic residue derived from a polybasic acid anhydride. Specific examples of $R^2$ include linear alkylene groups such as ethylene group, propylene group and butylene group, branched alkylene groups such as methylethylene, alkenylene groups such as vinylene group and propenylene group, branched alkenylene groups such as methylvinylene group, cycloalkylene groups such as cyclohexylene and methylcyclohexylene, cycloalkenylene groups such as cyclohexenylene group and methylcyclohexenylene group, and arylene groups such as phenylene group and naphthylene group. However, the present invention is of course not limited to these specific examples.

Among these, in view of availability of raw materials and easiness of synthesis, preferred are the following formulae (6) and (7):

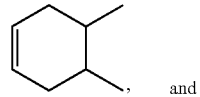

(6)

(7)

In formula (1), n represents an integer of 0 to 20. If n is 21 or more, the number of radical polymerization moieties per mass decreases due to large molecular weight and incomplete polymerization is liable to result. When n=0, the polymer compound of the present invention contains an allyl ester group, but in this case, the radical polymerizability is low as compared with the case of containing an allyl ether group when n is 1 or more. Therefore, n is preferably 1 or more.

The main chain of the curable polymer compound of the present invention is preferably a (meth)acrylic acid ester copolymer, because the physical properties of the coating film can be easily controlled.

The polymer compound having a side chain represented by formula (1) of the present invention may contain at the same time a side chain represented by the following formula (2):

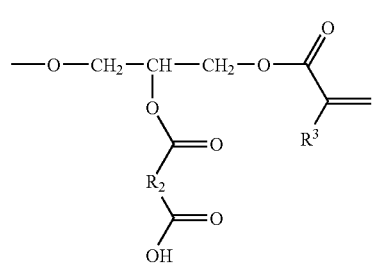

(2)

In formula (2), $R^3$ is either a hydrogen atom or a methyl group. When $R^3$ is a hydrogen atom, the polymer compound of the present invention has an acryloyl group, and when $R^3$ is a methyl group, the polymer compound of the present invention has a methacryloyl group. The purpose of introducing an acryloyl or methacryloyl group into the polymer compound of the present invention is to increase the curing rate and this introduction is very effective as means for increasing the curing rate. However, if the structure of formula (1) is excessively replaced by the structure of formula (2), polymerization inhibition by oxygen is incurred. Accordingly, the content ratio between the structure of formula (1) and the structure of formula (2) must be selected by taking account of the objective curing rate. The molar ratio of the number of groups represented by formula (1) contained in the polymer compound of the present invention to the number of groups represented by formula (2) is preferably 10 to 100:90 to 0, more preferably 20 to 90:80 to 10.

The polymer compound of the present invention contains a carboxyl group originated in a polybasic acid anhydride so as to have alkali solubility. The acid value (this means an acid value of the solid content and is measured according to JIS K0070, hereinafter the same) necessary for imparting proper alkali developability to the polymer compound of the present invention is preferably 30 mgKOH/g or more, more preferably from 45 to 160 mgKOH/g, and in view of good balance between the alkali solubility of uncured film and the alkali resistance of cured film, still more preferably from 50 to 140 mgKOH/g.

2. Production Step of Curable Polymer Compound

The present invention relates to a process for producing the polymer compound of the present invention, characterized by comprising the following production step.

Production Step A1

A production step of performing an addition reaction by using at least one or more polymer compound selected from the polymer compounds represented by the following formula (8):

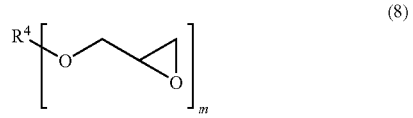

wherein $R^4$ represents a polymer compound residue, and m represents an integer of 2 or more and at least one or more compound selected from the compounds represented by the following formula (9):

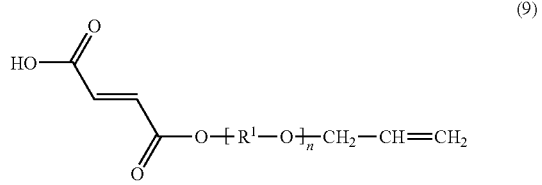

wherein $R^1$ each independently represents at least one or more organic residue selected from the group consisting of an alkylene group, a branched alkylene group, a cycloalkylene group, an aralkylene group and an arylene group, and n represents an integer of 0 to 20.

$R^1$ and n in formula (9) are the same as those in formula (1).

Production Step B1

In Production Step B1 of the present invention, together with at least one or more carboxylic acid of the compound of formula (9), a compound represented by the following formula (11):

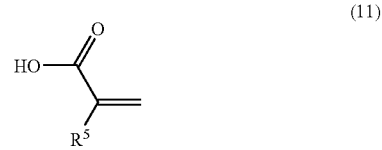

can be used in combination and this is preferred for the purpose of increasing the curing rate of the radical polymerizable resin polymer compound of the present invention.

In formula (11), $R^5$ represents either a hydrogen atom or a methyl group. That is, when $R^5$ is a hydrogen atom, the compound represented by formula (11) means an acrylic acid, and when $R^5$ is a methyl group, the compound represented by formula (11) means a methacrylic acid.

In the production process of the present invention, only an acrylic acid or only a methacrylic acid may be used as the compound represented by formula (11), or an acrylic acid and a methacrylic acid may also be used in combination.

Furthermore, as long as the curability of the radical polymerizable resin polymer compound of the present invention is not impaired, a carboxylic acid other than the compound represented by formula (11) can be used in combination with at least one or more carboxylic acid of the compound represented by formula (9). Examples of the carboxylic acid other than the compound represented by formula (11), which is used in combination with at least one or more carboxylic acid of the compound represented by formula (9), include an acetic acid, a propionic acid, a butyric acid, a benzoic acid, a 1-phenylbenzoic acid, a 2-phenylbenzoic acid, a 4-phenylbenzoic acid and a diphenylacetic acid. However, the present invention is of course not limited to these specific examples.

In Production Step A1 or B1 of the present invention, a catalyst is preferably used so as to accelerate the reaction.

The catalyst for use in Production Step A1 or B1 of the present invention is not particularly limited as long as it is commonly used in the reaction of an epoxy group and a carboxyl group. Specific examples of the catalyst used for this purpose include metal halides such as aluminum chloride, tin chloride and zinc chloride, pyridine-based compounds such as pyridine, α-picoline, isoquinoline and quinoline, pyridinium salts such as N-methylpyridinium chloride and N-ethylpyridinium chloride, quaternary ammonium salts such as benzyltrimethylammonium chloride, benzyltriethylammonium chloride, benzyltriethylammonium chloride and tetrabutylammonium bromide, phosphine-based compounds such as triphenylphosphine, phosphonium salts such as ethyltriphenylphosphonium bromide, tetraphenylphosphonium bromide and benzyltriphenylphosphonium chloride, hydroxides such as sodium hydroxide, potassium hydroxide and lithium hydroxide, and carbonates such as potassium carbonate and calcium carbonate.

Among these, in view of easy availability and addition-reaction rate, preferred are benzyltrimethylammonium chloride, benzyltriethylammonium chloride, tetrabutylammonium bromide, triphenylphosphine, ethyltriphenylphosphonium bromide, tetraphenylphosphonium bromide and benzyltriphenylphosphonium chloride.

In formula (8), $R^4$ represents a polymer compound residue, more specifically, a polymer compound having an epoxy group within the molecule. In the present invention, this polymer compound is preferably a (meth)acrylic acid ester copolymer having an epoxy group in the side chain, because the physical properties of the coating film can be easily controlled.

The (meth)acrylic acid ester copolymer having an epoxy group in the side chain can be obtained by radical-polymerizing a) an ethylenically unsaturated compound having an epoxy group and b) an ethylenically unsaturated compound except for a), in an organic solvent according to a known method. The compound of b) is used for the purpose of controlling the physical properties of the coating film.

Specific examples of a) the ethylenically unsaturated compound having an epoxy group include glycidyl (meth)acrylate, 3,4-epoxycyclohexylmethyl (meth)acrylate, 4-(2,3-epoxypropoxy)butyl (meth)acrylate and allyl glycidyl ether.

Specific examples of (b) the ethylenically unsaturated compound except for a) include vinyl compounds such as styrene, α-methylstyrene, (o,m,p-)hydroxystyrene and vinyl acetate, (meth)acrylates such as methyl (meth)acrylate, ethyl (meth)acrylate, n-propyl (meth)acrylate, isopropyl (meth)acrylate, n-butyl (meth)acrylate, sec-butyl (meth)acrylate, tert-butyl (meth)acrylate, n-hexyl (meth)acrylate, cyclohexyl (meth)acrylate, benzyl (meth)acrylate, phenoxyethyl (meth)acrylate, isobornyl (meth)acrylate, dicyclopentanyl (meth)acrylate, dicyclopentenyl (meth)acrylate, dicyclopentanyloxyethyl (meth)acrylate, dicyclopentenyloxyethyl (meth)acrylate, tetrahydrofurfuryl (meth)acrylate, (meth)acrylonitrile, 2-hydroxyethyl (meth)acrylate, 2-hydroxypropyl (meth)acrylate, N,N-dimethylaminoethyl (meth)acrylate, trifluoroethyl acrylate, 2,2,3,3-tetrafluoropropyl (meth)acrylate and perfluorooctylethyl (meth)acrylate, and compounds having an amide group, such as (meth)acrylamide, N,N-dimethyl(meth)acrylamide, N,N-diethyl (meth)acrylamide, N-methyl (meth)acrylamide, N-ethyl (meth)acrylamide, N-isopropyl (meth)acrylamide, N-vinylpyrrolidone, N-vinylcaprolactam and N-(meth)acryloylmorpholine.

The copolymerization ratio of a) to b) is preferably, in terms of the molar ratio, from 5:95 to 90:10, more preferably from 10:90 to 80:20. If the copolymerization ratio of a) is less than 5, the radical polymerizability decreases, whereas if the copolymerization ratio of a) exceeds 90, the storage stability is worsened.

The molecular weight of the (meth)acrylic acid ester copolymer having an epoxy group for use in the present invention is, in terms of the polystyrene-equivalent weight average molecular weight by GPC, preferably from 1,000 to 500,000, more preferably from 3,000 to 200,000. If the molecular weight is less than 1,000, the film strength after curing extremely decreases, whereas if it exceeds 500,000, the alkali developability extremely decreases.

The radical polymerization of the (meth)acrylic acid ester copolymer having an epoxy group in the side chain is preferably performed in an organic solvent which is inactive to (does not react with) the epoxy group. Specific examples of the organic solvent include benzene, toluene, xylene, tetrahydrofuran, dibutyl ether, diethylene glycol dimethyl ether, ethylene glycol diethyl ether, propylene glycol monomethyl ether acetate, propylene glycol monoethyl ether acetate, diethylene glycol ethyl ether acetate, methyl methoxypropionate, ethyl methoxypropionate, methyl ethoxypropionate, ethyl ethoxypropionate, ethyl acetate, isoamyl acetate, ethyl lactate, acetone, methyl ethyl ketone, cyclohexanone, N,N-dimethylformamide and N-methylpyrrolidone.

The reaction temperature at the addition reaction in Production Step A1 or B1 of the present invention is not particularly limited but is generally from 0 to 200° C., preferably from 20 to 150° C., more preferably from 50 to 120° C. If the reaction temperature is less than 0° C., the reaction proceeds very slowly, whereas if it exceeds 200° C., polymerization or decomposition may be disadvantageously brought about.

In the addition reaction of Production Step A1 or B1, an organic solvent may be used. Particularly, in the case of using a solid or high-viscosity raw material, stirring becomes difficult and therefore, an organic solvent is preferably used. The organic solvent which can be used is not particularly limited as long as it does not inhibit the addition reaction, but examples thereof include benzene, toluene, xylene, tetrahydrofuran, dibutyl ether, diethylene glycol dimethyl ether, ethylene glycol diethyl ether, propylene glycol monomethyl ether acetate, propylene glycol monoethyl ether acetate, diethylene glycol ethyl ether acetate, methyl methoxypropionate, ethyl methoxypropionate, methyl ethoxypropionate, ethyl ethoxypropionate, ethyl acetate, isoamyl acetate, ethyl lactate, acetone, methyl ethyl ketone, cyclohexanone, N,N-dimethylformamide and N-methylpyrrolidone. These solvents may be used individually or in combination of two or more thereof.

With respect to the ratio of raw materials charged in the addition reaction of Production Step A1 or B1, the total molar number of the compound represented by formula (9) and the compound represented by formula (11) is from 1.0 to 1.5 mol, preferably from 1.05 to 1.2 mol, per mol of the epoxy group in the compound represented by formula (8). If the total molar number of the compound represented by formula (9) and the compound represented by formula (11) is less than 1.0 mol per mol of the epoxy group in the compound represented by formula (8), the epoxy group remains and the remaining epoxy group reacts with the carboxyl group produced in Production Step A2 or B2 to cause three-dimensional crosslinking, as a result, the objective polymer compound cannot be obtained. On the other hand, if the total molar number exceeds 1.5 mol, the compounds represented by formulae (9) and (11) become excessive and insufficient curing may disadvantageously result.

The molar ratio of the number of groups represented by formula (9) to the number of groups represented by formula (11) is preferably 10 to 100:90 to 0, more preferably 20 to 90:80 to 10.

The amount of the catalyst used in Production Step A1 or B1 is from 0.01 to 10 parts by mass, preferably from 0.1 to 5 parts by mass, more preferably from 0.1 to 3 parts by mass, per 100 parts by mass in total of the compound represented by formula (8), the compound represented by formula (9) and the compound represented by formula (11). If the amount of the catalyst used is less than 0.01 part by mass, the reaction rate decreases, as a result, the heating time is prolonged and this may disadvantageously causes thermal polymerization of the produced polymerizable compound, whereas if it exceeds 10 parts by mass, outstanding coloring may result and this is not preferred.

In Production Step A1 or B1, a polymerization inhibitor may be further used so as to prevent unintended thermal polymerization and curing reaction of the produced polymer compound. The polymerization inhibition used is not particularly limited, but examples thereof include general radical polymerization inhibitors such as quinones, (e.g., p-benzoquinone, 2,5-diphenyl-p-benzoquinone), hydroquinone, hydroquinone monomethyl ether, p-tert-butylcatechol, 2,5-di-tert-butylhydroquinone, mono-tert-butylhydroquinone and phenothiazine.

Production Step A2 or B2

Production Step A1 or B1 is followed by a step of adding a polybasic acid anhydride represented by the following formula (10):

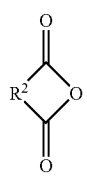
(10)

wherein $R^2$ each independently represents at least one or more organic residue selected from the group consisting of an alkylene group, a branched alkylene group, an alkenylene group, a branched alkenylene group, a cycloalkylene group, a cycloalkenylene group and an arylene group to obtain a polymer compound.

In Production Step A2 or B2, the reaction of the polybasic acid anhydride with the polymer compound obtained in Production Step A1 or B1 may be performed without a catalyst or if desired, by using a catalyst. The catalyst used is suitably a tertiary amine such as triethylamine, trioctylamine, benzyldimethylamine and 2,4,6-tris(dimethylaminomethyl)phenol.

In the polybasic acid anhydride which is preferably used, $R^2$ of formula (10) each is independently at least one or more organic residue selected from an alkylene group, a branched alkylene group, an alkenylene group, a branched alkenylene group, a cycloalkylene group, a cycloalkenylene group and an arylene group.

Specific examples of $R^2$ include linear alkyl groups such as ethylene group, propylene group and butylene group, branched alkyl groups such as methylethylene group, alkenylene groups such as vinylene group and propenylene group, branched alkenylene groups such as methylvinylene group, cycloalkylene groups such as cyclohexylene group and methylcyclohexylene group, cyclohexenylene groups such as cyclohexenylene group and methylcyclohexenylene group, and arylene groups such as phenylene group and naphthylene group. However, the present invention is of course not limited to these specific examples.

Among these, in view of availability of raw materials and easiness of synthesis, $R^2$ preferably has a structure represented by the following formula (6) or (7):

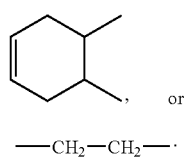
, or (6)

—CH$_2$—CH$_2$—. (7)

As for the proper amount of the polybasic acid anhydride added, this is sufficient if an acid value (this means an acid value of the solid content) necessary for imparting proper alkali developability to the polymer compound of the present invention can be reached. In this case, the acid value is preferably 30 mgKOH/g or more, more preferably from 45 to 160 mgKOH/g, and in view of good balance between the alkali solubility and the alkali resistance of cured film, still more preferably from 50 to 140 mgKOH/g.

The reaction temperature at the addition reaction in Production Step A2 or B2 for use in the production process of the present invention is not particularly limited but is generally from 0 to 200° C., preferably from 20 to 100° C. If the reaction temperature is less than 0° C., the reaction proceeds very slowly, whereas if it exceeds 200° C., polymerization or decomposition may be disadvantageously brought about.

3. Radical Polymerizable•Curable Composition

The radical polymerizable•curable composition of the present invention is described in more detail.

The radical polymerizable•curable composition of the present invention is a radical polymerizable•curable composition characterized by essentially comprising at least one or more polymer compound of the present invention.

The radical polymerizable•curable composition of the present invention can be obtained by mixing, if desired, various ethylenically unsaturated compounds, solvents, photo- or heat-radical polymerization initiators and the like with the polymer compound of the present invention.

The radical polymerizable•curable composition of the present invention may contain an ethylenically unsaturated compound. The ethylenically unsaturated compound which can be used is not particularly limited as long as it has radical polymerizability, but examples thereof include, as the monomer, the following compounds:

alkyl (meth)acrylates such as methyl (meth)acrylate, ethyl (meth)acrylate, propyl (meth)acrylate, n-butyl (meth)acrylate, isobutyl (meth)acrylate, sec-butyl (meth)acrylate, tert-butyl (meth)acrylate, hexyl (meth)acrylate, octyl (meth)acrylate, isooctyl (meth)acrylate, 2-ethylhexyl (meth)acrylate, decyl (meth)acrylate, lauryl (meth)acrylate and stearyl (meth)acrylate; alicyclic (meth)acrylates such as cyclohexyl (meth)acrylate, bornyl (meth)acrylate, isobornyl (meth)acrylate, dicyclopentenyl (meth)acrylate and dicyclopentenyloxyethyl (meth)acrylate, aromatic (meth)acrylates such as benzyl (meth)acrylate, phenyl (meth)acrylate, phenylcarbitol (meth)acrylate, nonylphenyl (meth)acrylate, nonylphenylcarbitol (meth)acrylate and nonylphenoxy (meth)acrylate; (meth)acrylates having a hydroxyl group, such as 2-hydroxyethyl (meth)acrylate, hydroxypropyl (meth)acrylate, hydroxybutyl (meth)acrylate, butanediol mono(meth)acrylate, glycerol (meth)acrylate, polyethylene glycol (meth)acrylate and glycerol di(meth)acrylate; (meth)acrylates having an amino group, such as 2-dimethylaminoethyl(meth)acrylate, 2-diethylaminoethyl (meth)acrylate and 2-tert-butylaminoethyl (meth)acrylate; methacrylates having a phosphorus atom, such as methacryloxyethyl phosphate, bis•methacryloxyethyl phosphate and methacryloxyethylphenyl acid phosphate; di(meth)acrylates such as ethylene glycol di(meth)acrylate, diethylene glycol di(meth)acrylate, triethylene glycol di(meth)acrylate, tetraethylene glycol di(meth)acrylate, polyethylene glycol di(meth)acrylate, propylene glycol di(meth)acrylate, dipropylene glycol di(meth)acrylate, tripropylene glycol di(meth)acrylate, 1,4-butanediol di(meth)acrylate, 1,3-butanediol di(meth)acrylate, neopentyl glycol di(meth)acrylate, 1,6-hexanediol di(meth)acrylate and bis•glycidyl (meth)acrylate;

poly(meth)acrylates such as trimethylolpropane tri(meth)acrylate, pentaerythritol tri(meth)acrylate and dipentaerythritol hexa(meth)acrylate; modified polyol poly(meth)acrylates such as ethylene oxide 4 mol-added di(meth)acrylate of bisphenol S, ethylene oxide 4 mol-added di(meth)acrylate of bisphenol A, aliphatic acid-modified pentaerythritol di(meth) acrylate, propylene oxide 3 mol-added tri(meth)acrylate of trimethylolpropane, and propylene oxide 6 mol-added tri (meth)acrylate of trimethylolpropane;

polyacrylates having an isocyanuric acid skeleton, such as bis(acryloyloxyethyl)monohydroxyethyl isocyanurate, tris (acryloyloxyethyl) isocyanurate and ε-caprolactone-added tris(acryloyloxyethyl) isocyanurate; polyester acrylates such as α,ω-diacryloyl-(bisethylene glycol)-phthalate and α,ω-tetraacryloyl-(bistrimethylolpropane)-tetrahydrophthalate; glycidyl (meth)acrylate; allyl (meth)acrylate; ω-hydroxyhexanoyloxyethyl (meth)acrylate; polycaprolactone (meth)acrylate; (meth)acryloyloxyethyl phthalate; (meth)acryloyloxyethyl succinate; 2-hydroxy-3-phenoxypropyl acrylate; phenoxyethyl acrylate; and N-vinyl compounds such as N-vinylpyrrolidone, N-vinylformamide and N-vinylacetamide.

Also, examples as the oligomer include polyester (meth) acrylate, urethane (meth)acrylate and epoxy (meth)acrylate.

Furthermore, as the resin, a (meth)acrylic acid ester copolymer having an ethylenically unsaturated group in the side chain may also be used without any problem, which is obtained by reacting an epoxy group of a compound having an epoxy group and an ethylenically unsaturated group in one molecule, such as glycidyl (meth)acrylate, 3,4-epoxycyclohexylmethyl (meth)acrylate, 4-(2,3-epoxypropoxy)butyl (meth)acrylate and allyl glycidyl ether, with a part of carboxyl groups in the side chain of a (meth)acrylic acid ester copolymer, or by reacting an isocyanate group of a compound having an isocyanate group and an ethylenically unsaturated group in one molecule, such as 2-methacryloyloxyethyl isocyanate, with a part or all of hydroxyl groups of a (meth)acrylic acid ester copolymer.

Among these, preferred are poly(meth)acrylates such as trimethylolpropane tri(meth)acrylate, pentaerythritol tetra (meth)acrylate and dipentaerythritol hexa(meth)acrylate, because good curability can be obtained.

The radical polymerizable•curable composition of the present invention can be cured by heat or by an active energy ray such as electron beam, γ ray, X ray, ultraviolet ray, visible light and near infrared ray. In the case of curing the composition by using a high energy ray such as electron beam and γ ray, the curing can be performed without an initiator (by using no catalyst). However, in use for resists such as etching resist, solder resist and color filter resist, the composition must be cured with light at a wavelength of 200 to 500 nm and therefore, may contain a photo-radical polymerization initiator. The photo-radical polymerization initiator means a photo-radical generator alone or a combination of a photo-radical generator and a sensitizer.

Specific examples of the photo-radical generator include acetophenone-based compounds such as 2-hydroxy-2-methyl-1-phenylpropan-1-one, 1-(4-isopropylphenyl)-2-methylpropan-1-one, 1-(4-butylphenyl)-2-hydroxy-2-methylpropan-1-one, 1-(4-methoxyphenyl)-2-methylpropan-1-one, 1-(4-methylthiophenyl)-2-methylpropan-1-one, 1-hydroxycyclohexyl phenyl ketone, 2-hydroxy-1-(4-(2-hydroxyethoxy)-phenyl)-2-methylpropan-1-one, 2-methyl-1-[(4-methylthio)phenyl]-2-morpholino-propan-1-one, 2-benzyl-2-dimethylamino-1-(4-morpholinophenyl)-butan-1-one and 2-benzyl-2-dimethylamino-1-(4-dimethylaminophenyl)-butan-1-one; benzoin-based compounds and derivatives thereof, such as benzoin methyl ether, benzoin ethyl ether, benzoin isopropyl ether, benzyl dimethyl ketal and benzyl; acylphosphine oxide-based compounds such as 2,4,6-trimethylbenzoyldiphenylphosphine oxide and bis(2,6-dimethoxybenzoyl)-2,4,6-trimethylpentylphosphine oxide; hexaarylbiimidazole-based compounds such as 2,2'-bis(o-chlorophenyl)-4,4',5,5'-tetraphenyl-1,2'-biimidazole, 2,2'-bis(o-bromophenyl)-4,4',5,5'-tetraphenyl-1,2'-biimidazole, 2,2'-bis(o-fluorophenyl)-4,4',5,5'-tetraphenyl-1,2'-biimidazole, 2,2'-bis(o,p-dichlorophenyl)-4,4',5,5'-tetraphenyl-1,2'-biimidazole, 2,2'-bis(2-chlorophenyl)-4,4'-5,5'-tetrakis(4-methylphenyl)-1,2'-biimidazole and 2,2'-bis(2-chlorophenyl)-4,4'-5,5'-tetrakis(4-methoxyphenyl)-1,2'-biimidazole; compounds such as methylphenyl glyoxylate, α-acyloxime ester and camphorquinone; organic boron salt-based compounds described in Kokai No. 2000-249822; titanocene-based compounds described, for example, in Kokai Nos. 4-221958 and 4-21975; and triazine-based compounds described, for example, in Kokai No. 10-253815.

These photo-radical generators may be used individually or in combination of two or more thereof.

In order to more elevate the sensitivity, a general sensitizer used in normal photo-radical polymerization initiator systems may be used together with the above-described photo-radical generator. For more elevating the sensitivity, one or more compound selected from the group consisting of a benzophenone-based compound, a thioxanthone-based compound and a ketocoumarin-based compound is preferably used.

Specific examples of the compound which can be used include benzophenone-based compounds such as benzophenone, 2,4,6-trimethylbenzophenone, 4-phenylbenzophenone, 4-benzoyl-4'-methyldihenylsulfide, 4,41'-bis(dimethylamino)benzophenone and 4,4'-bis(diethylamino) benzophenone; thioxanthone-based compounds such as thioxanthone, 2-methylthioxanthone, 2,4-dimethylthioxanthone, 2,4-diethylthioxanthone, isopropylthioxanthone, 2,4-diisopropylthioxanthone and 2-chlorothioxanthone; and ketocoumarin-based compounds such as 3-acetylcoumarin, 3-acetyl-7-diethylaminocoumarin, 3-benzoylcoumarin, 3-benzoyl-7-diethylaminocoumarin, 3-benzoyl-7-methoxycoumarin, 3,3'-carbonylbiscoumarin, 3,3'-carbonylbis(7-methoxycoumarin) and 3,3'-carbonylbis(5,7-dimethoxycoumarin). These may be used individually or as a mixture of two or more thereof.

The amount of the photo-radical polymerization initiator blended is preferably from 0.1 to 40 parts by mass, more preferably from 0.5 to 30 parts by mass, per 100 parts by mass of the radical polymerizable•curable composition.

In the radical polymerizable•curable composition of the present invention, a polyfunctional thiol compound having two or more mercapto groups within one molecule may be used as a chain transfer agent to form a part of the photo-radical polymerization initiator system. By the addition of polyfunctional thiol, the polymerization inhibition by oxygen is more prevented and a high-sensitivity photo-radical polymerizable•curable composition can be obtained. Specific examples of the polyfunctional thiol compound include hexanedithiol, decanedithiol, 1,4-butanediol bis(3-mercaptopropionate), 1,4-butanediol bis(mercaptoacetate), ethylene glycol bis(mercaptoacetate), ethylene glycol bis(3-mercaptopropionate), trimethylolpropane tris (mercaptoacetate), trimethylolpropane tris(3-mercaptopropionate), pentaerythritol tetrakis (mercaptoacetate) and pentaerythritol tetrakis(3-mercaptopropionate).

However, the polyfunctional thiol compound having a primary mercapto group has a problem in that the mercapto group reacts with an ethylenically unsaturated group such as (meth)acryloyl group during storage, as a result, the sensitivity after storage decreases. For the purpose of obtaining storage stability, a polyfunctional thiol compound having a mercapto group structural moiety of the following formula (12):

$$—(CH_2)_kC(R^6)(R^7)(CH_2)_jSH \qquad (12)$$

wherein $R^6$ and $R^7$ each independently represents a hydrogen atom or an alkyl group having from 1 to 10 carbon atoms, at least one of $R^6$ and $R^7$ is an alkyl group, k represents an integer of 0 to 2, and j represents an integer of 0 or 1 is preferably used.

Specific examples of the polyfunctional thiol compound having a mercapto group structural moiety of formula (12) include ethylene glycol bis(3-mercaptobutyrate), 1,2-propylene glycol bis(3-mercaptobutyrate), diethylene glycol bis(3-mercaptobutyrate), 1,4-butanediol bis(3-mercaptobutyrate), 1,8-octanediol bis(3-mercaptobutyrate), trimethylolpropane tris(3-mercaptobutyrate), pentaerythritol tetrakis(3-mercaptobutyrate), dipentaerythritol hexakis(3-mercaptobutyrate), ethylene glycol bis(2-mercaptopropionate), 1,2-propylene glycol bis(2-mercaptopropionate), diethylene glycol bis(2-mercaptopropionate), 1,4-butanediol bis(2-mercaptopropionate), 1,8-octanediol bis(2-mercaptopropionate), trimethylolpropane tris(2-mercaptopropionate), pentaerythritol tetrakis(2-mercaptopropionate), dipentaerythritol hexakis(2-mercaptopropionate), ethylene glycol bis(3-mercaptoisobutyrate), 1,2-propylene glycol bis(3-mercaptoisobutyrate), diethylene glycol bis(3-mercaptoisobutyrate), 1,4-butanediol bis(3-mercaptoisobutyrate), 1,8-octanediol bis(3-mercaptoisobutyrate), trimethylolpropane tris(3-mercaptoisobutyrate), pentaerythritol tetrakis(3-mercaptoisobutyrate), dipentaerythritol hexakis(3-mercaptoisobutyrate), ethylene glycol bis(2-mercaptoisobutyrate), 1,2-propylene glycol bis(2-mercaptoisobutyrate), diethylene glycol bis(2-mercaptoisobutyrate), 1,4-butanediol bis(2-mercaptoisobutyrate), 1,8-octanediol bis(2-mercaptoisobutyrate), trimethylolpropane tris(2-mercaptoisobutyrate), pentaerythritol tetrakis(2-mercaptoisobutyrate) and dipentaerythritol hexakis(2-mercaptoisobutyrate).

4. Photocured Product Having Pattern

The polymer compound used in the radical polymerizable•curable composition having blended therein the photo-radical polymerization initiator of the present invention (hereinafter, the composition is sometimes referred to as a "photo-radical polymerizable•curable composition) has a carboxyl group in the molecule and therefore, this composition can be suitably used as an alkali-developable photosensitive material for the formation of a pattern. In the case of using the photo-radical polymerizable•curable composition of the present invention as an alkali-developable photosensitive material, a pattern can be formed through the following fabrication steps:

Fabrication Step 1:
a step of coating the photo-radical polymerizable•curable composition of the present invention on a substrate, Fabrication Step 2:
a step of drying the organic solvent, Fabrication Step 3:
a step of exposing the composition through a photomask, and Fabrication Step 4:
a step of developing the composition with an alkali developer for a predetermined time and then washing it with water.

Each step is described in detail below.

4-(1) Fabrication Step 1: Coating Step

In Fabrication Step 1, the photo-radical polymerizable•curable composition of the present invention is coated on a substrate to a predetermined thickness.

The kind of the substrate varies depending on use, but examples of the substrate include inorganic glasses such as quartz glass, borosilicate glass and lime-soda glass with silica-coated surface, films or sheets of thermoplastic resin such as polyester (e.g., polyethylene terephthalate), polyolefin (e.g., polypropylene, polyethylene), polycarbonate, polymethyl methacrylate and polysulfone, and thermosetting resin such as epoxy resin, polyester resin and polyimide resin, sheets or foils of metals such as copper, aluminum and iron, and composite materials of such a thermoplastic or thermosetting resin and such a metal.

For the coating, a dip coater, a roll coater, a wire bar, a flow coater, a die coater, a spray coating method, a rotary coating method such as spinner, and a screen printing method are suitably used.

The coating thickness varies depending on use, but the film thickness after drying the organic solvent is preferably from 0.1 to 200 μm. more preferably from 0.5 to 100 μm.

4-(2) Fabrication Step 2: Organic Solvent-drying Step

The organic solvent of the sample obtained by coating the composition in 4-(1) is dried preferably by using a drying device such as hot plate, IR oven and convection oven. The drying condition is preferably from 40 to 150° C. and the drying time is preferably from 10 seconds to 60 minutes. Also, the organic solvent may be dried in a vacuum.

4-(3) Fabrication Step 3: Exposure Step

Examples of the light source for use in exposure include lamp sources such as xenon lamp, high-pressure mercury lamp, ultrahigh-pressure mercury lamp, metal halide lamp, medium-pressure mercury lamp and low-pressure mercury lamp, and laser light sources such as argon ion laser, YAG laser, excimer laser and nitrogen laser. In the case of using only a specific wavelength of light irradiated, an optical filter may also be used.

With respect to the exposure method, a photomask is closely contacted on the sample or a photomask is placed while providing an appropriate gap between the sample and the photomask, and thereafter, image exposure is performed through the photomask.

4-(4) Fabrication Step 4: Alkali Development•Water Washing Step

The development is performed by using an alkali developer and developing the resist, for example, according to a dip, shower or paddle method. Examples of the alkali developer include an aqueous solution containing an inorganic alkali agent such as sodium carbonate, potassium carbonate, sodium silicate, potassium silicate, sodium hydroxide and potassium hydroxide, or an organic alkali agent such as diethanolamine, triethanolamine and tetraalkylammonium hydroxide salt. The alkali developer may contain, if desired, a surfactant, a water-soluble organic solvent, a hydroxyl or carboxyl group-containing low molecular compound and the like. Particularly, a surfactant is preferably added, because many surfactants have an improvement effect on developability, resolution, background staining or the like.

Examples of the surfactant for developer include anionic surfactants having a sodium naphthalenesulfonate group or a sodium benzenesulfonate group, nonionic surfactants having a polyalkyleneoxy group, and cationic surfactants having a tetraalkylammonium group. The development method is not particularly limited, but a method such as dipping development, spray development, brush development and ultrasonic development is usually performed at a development temperature of 10 to 50° C., preferably 15 to 45° C.

After the completion of alkali development, the sample is washed with water to wash out the alkali developer, whereby excessive alkali development is prevented. Contact with an alkali developer for longer time than is necessary causes a problem of reducing the pattern width more than the objective width.

Through these steps, a pattern of the cured product using the photo-radical polymerizable•curable composition of the present invention can be formed.

EXAMPLES

The present invention is described in greater detail below by referring to Examples, however, the present invention is not limited thereto.

Synthesis of (Meth)acrylic Acid Ester Copolymer Having Epoxy Group

Synthesis Example 1

ACP-1

Into a 1 liter-volume four-neck flask equipped with a dropping funnel, a thermometer, a condenser tube and a stirrer, 88.0 g (0.619 mol) of glycidyl methacrylate (hereinafter simply referred to as "GMA", produced by Tokyo Kasei Kogyo Co., Ltd.), 62.0 g (0.619 mol) of methyl methacrylate (hereinafter simply referred to as "MMA", produced by Kyoeisha Chemical Co., Ltd.), 0.93 g of 2-mercaptoethanol (produced by Wako Pure Chemical Industries, Ltd.) and 350.0 g of propylene glycol monomethyl ether acetate (hereinafter simply referred to as "PMA", produced by Tokyo Kasei Kogyo Co., Ltd.) were charged. After purging the inside of the four-neck flask with nitrogen for 1 hour, the flask was heated to 90° C. in an oil bath, then a mixed solution containing 88.0 g of GMA, 62.0 g of MMA, 0.93 g of 2-mercaptoethanol, 350.0 parts by mass of PMA and 6.3 g of 2,2'-azobisisobutyronitrile (hereinafter simply referred to as "AIBN", produced by Wako Pure Chemical Industries, Ltd.) was added dropwise over 1.5 hours, and the polymerization was performed for 3 hours. Thereafter, the flask was heated to 100° C., a mixed solution containing 2.1 parts by mass of AIBN and 27 parts by mass of PMA was added thereto and after further performing the polymerization for 1.5 hours, the flask was allowed to cool. The solid content in ACP-1 was 28.6 mass % and the polystyrene-equivalent weight average molecular weight as measured by GPC was 14,000.

Synthesis Example 2

ACP-2

Into a 1 liter-volume four-neck flask equipped with a dropping funnel, a thermometer, a condenser tube and a stirrer, 115.0 g (0.809 mol) of GMA, 34.8 g (0.348 mol) of MMA, 0.93 g of 2-mercaptoethanol (produced by Wako Pure Chemical Industries, Ltd.) and 350.0 g of PMA were charged. After purging the inside of the four-neck flask with nitrogen for 1 hour, the flask was heated to 90° C. in an oil bath, then a mixed solution containing 115.0 g of GMA, 34.8 g of MMA, 0.93 g of 2-mercaptoethanol, 350.0 parts by mass of PMA and 6.3 g of AIBN was added dropwise over 1.5 hours, and the polymerization was performed for 3 hours. Thereafter, the flask was heated to 100° C., a mixed solution containing 2.1 parts by mass of AIBN and 27 parts by mass of PMA was added thereto and after further performing the polymerization for 1.5 hours, the flask was allowed to cool. The solid content in ACP-2 was 29.2 mass % and the polystyrene-equivalent weight average molecular weight as measured by GPC was 15,000.

Synthesis Example 3

ACP-3

Into a 1 liter-volume four-neck flask equipped with a dropping funnel, a thermometer, a condenser tube and a stirrer, 67.0 g (0.472 mol) of GMA, 83.0 g (0.472 mol) of benzyl methacrylate (hereinafter simply referred to as "BzMA", produced by Kyoeisha Chemical Co., Ltd.), 0.93 g of 2-mercaptoethanol (produced by Wako Pure Chemical Industries, Ltd.) and 350.0 g of PMA were charged. After purging the inside of the four-neck flask with nitrogen for 1 hour, the flask was heated to 90° C. in an oil bath, then a mixed solution containing 67.0 g of GMA, 83.0 g of BzMA, 0.93 g of 2-mercaptoethanol, 350.0 parts by mass of PMA and 6.3 g of AIBN was added dropwise over 1.5 hours, and the polymerization was performed for 3 hours. Thereafter, the flask was heated to 100° C., a mixed solution containing 2.1 parts by mass of AIBN and 27 parts by mass of PMA was added thereto and after further performing the polymerization for 1.5 hours, the flask was allowed to cool. The solid content in ACP-3 was 28.9 mass % and the polystyrene-equivalent weight average molecular weight as measured by GPC was 14,000.

Synthesis of Compound Represented by Formula (9)

Synthesis Example 4

Monoallyloxyethyl Fumarate (Hereinafter Simply Referred as "H-BAF")

In a 2 liter-volume flask, 500 g (5.10 mol) of maleic anhydride (produced by Tokyo Kasei Kogyo Co., Ltd.), 573 g (5.61 mol) of ethylene glycol monoallyl ether (produced by Tokyo Kasei Kogyo Co., Ltd.) and 0.05 g of hydroquinone monomethyl ether (produced by Junsei Chemical Co., Ltd.) were charged. Then, in a nitrogen stream, the flask was heated to 50° C. in an oil bath while stirring the reaction solution with a magnetic stirrer. After 24 hours, the heating was stopped and the flask was cooled. The obtained reaction solution was analyzed by a high-performance liquid chromatograph, as a result, the conversion of maleic anhydride was 95%.

Subsequently, 499.54 g of the reaction solution obtained above was charged into a 2 liter-volume flask equipped with a refluxer and further, 215.07 g of toluene (produced by Junsei Chemical Co., Ltd.), 4.99 g (1 mass % based on raw materials) of concentrated hydrochloric acid (produced by Kokusan Chemical Co., Ltd.) and 0.25 g of hydroquinone monomethyl ether were charged. Then, in a nitrogen stream, the flask was heated to 140° C. in an oil bath while stirring the reaction solution with a magnetic stirrer to reflux toluene. After 3 hours, the heating was stopped and the flask was cooled. Thereafter, 500 ml of toluene was added to the obtained reaction solution and the resulting solution was filtered to remove insoluble matters. Furthermore, in order to remove hydrochloric acid, 500 ml of water was added to the filtrate and the resulting solution was subjected to liquid separation in a separating funnel. The toluene layer was concentrated by an evaporator to obtain 428 g of the objective H-BAF. The yield based on maleic anhydride was 90%.

Synthesis of Polymer Compound

Example 1

Sample A

Into a 500 ml-volume four-neck separable flask equipped with a dropping funnel, a thermometer, a condenser tube, a stirrer and an air inlet tube, 300 g (362 mmol as epoxy group) of ACP-1, 38.0 g (190 mmol) of H-BAF, 13.7 g (190 mmol) of acrylic acid (produced by Tokyo Kasei Kogyo Co., Ltd.), 3.0 g of tetrabutylammonium bromide (produced by Tokyo Kasei Kogyo Co., Ltd.) and 0.15 g of methoquinone were charged. Subsequently, the flask was heated to 90° C. in an oil bath while introducing air into the reaction solution. After 15 hours, the heating was stopped and the flask was cooled. At this time, the acid value was 2.8. Thereafter, 44.0 g (289 mmol) of tetrahydrophthalic anhydride (produced by Tokyo Kasei Kogyo Co., Ltd.) was added to the reaction solution and then the flask was heated to 45° C. in an oil bath. After performing the reaction until the absorption of carbonyl group of the acid anhydride group disappeared in FT-IR (FT/IR-8000, manufactured by JASCO Corporation), the flask was cooled. The obtained compound was designated as "Sample A". The solid content concentration of Sample A was 46.1 mass % and the acid value of solid content was 90. Also, the polystyrene-equivalent weight average molecular weight by GPC was 55,000. FIG. 1 shows the IR spectrum of Sample A.

Example 2

Sample B

Into a 500 ml-volume four-neck separable flask equipped with a dropping funnel, a thermometer, a condenser tube, a stirrer and an air inlet tube, 300 g (362 mmol as epoxy group) of ACP-1, 19.0 g (95 mmol) of H-BAF, 20.5 g (285 mmol) of acrylic acid, 3.0 g of tetrabutylammonium bromide and 0.15 g of methoquinone were charged. Subsequently, the flask was heated to 90° C. in an oil bath while introducing air into the reaction solution. After 15 hours, the heating was stopped and the flask was cooled. At this time, the acid value was 2.5. Thereafter, 44.0 g (289 mmol) of tetrahydrophthalic anhydride was added to the reaction solution and then the flask was heated to 45° C. in an oil bath. After performing the reaction until the absorption of carbonyl group of the acid anhydride group disappeared in FT-IR, the flask was cooled. The obtained compound was designated as "Sample B". The solid content concentration of Sample B was 44.9 mass % and the acid value of solid content was 94. Also, the polystyrene-equivalent weight average molecular weight by GPC was 42,000. FIG. 2 shows the IR spectrum of Sample B.

Example 3

Sample C

Into a 500 ml-volume four-neck separable flask equipped with a dropping funnel, a thermometer, a condenser tube, a stirrer and an air inlet tube, 300 g (472 mmol as epoxy group) of ACP-2, 24.8 g (124 mmol) of H-BAF, 26.8 g (372 mmol) of acrylic acid, 3.0 g of tetrabutylammonium bromide and 0.15 g of methoquinone were charged. Subsequently, the flask was heated to 90° C. in an oil bath while introducing air into the reaction solution. After 15 hours, the heating was stopped and the flask was cooled. At this time, the acid value was 3.0. Thereafter, 57.5 g (378 mmol) of tetrahydrophthalic anhydride was added to the reaction solution and then the flask was heated to 45° C. in an oil bath. After performing the reaction until the absorption of carbonyl group of the acid anhydride group disappeared in FT-IR, the flask was cooled. The obtained compound was designated as "Sample C". The solid content concentration of Sample C was 48.5 mass % and the acid value of solid content was 110. Also, the polystyrene-equivalent weight average molecular weight by GPC was 39,000. FIG. 3 shows the IR spectrum of Sample C.

Example 4

Sample D

Into a 500 ml-volume four-neck separable flask equipped with a dropping funnel, a thermometer, a condenser tube, a stirrer and an air inlet tube, 300 g (274 mmol as epoxy group) of ACP-3, 14.7 g (73 mmol) of H-BAF, 15.9 g (221 mmol) of acrylic acid, 2.5 g of tetrabutylammonium bromide and 0.15 g of methoquinone were charged. Subsequently, the flask was heated to 90° C. in an oil bath while introducing air into the reaction solution. After 15 hours, the heating was stopped and the flask was cooled. At this time, the acid value was 2.5. Thereafter, 16.5 g (165 mmol) of succinic anhydride was added to the reaction solution and then the flask was heated to 65° C. in an oil bath. After performing the reaction until the absorption of carbonyl group of the acid anhydride group disappeared in FT-IR, the flask was cooled. The obtained compound was designated as "Sample D". The solid content concentration of Sample D was 39.0 mass % and the acid value of solid content was 75. Also, the polystyrene-equivalent weight average molecular weight by GPC was 51,000. FIG. 4 shows the IR spectrum of Sample D.

Comparative Example 1

Comparative Sample A

Into a 500 ml-volume four-neck separable flask equipped with a dropping funnel, a thermometer, a condenser tube, a stirrer and an air inlet tube, 300 g (362 mmol as epoxy group) of ACP-1, 27.4 g (380 mmol) of acrylic acid, 3.0 g of tetrabutylammonium bromide (produced by Tokyo Kasei Kogyo Co., Ltd.) and 0.15 g of methoquinone were charged. Subsequently, the flask was heated to 90° C. in an oil bath while introducing air into the reaction solution. After 15 hours, the heating was stopped and the flask was cooled. At this time, the acid value was 3.1. Thereafter, 44.0 g (289 mmol) of tetrahydrophthalic anhydride was added to the reaction solution and then the flask was heated to 45° C. in an oil bath. After performing the reaction until the absorption of carbonyl group of the acid anhydride group disappeared in FT-IR, the flask was cooled. The obtained compound was designated as "Comparative Sample A". The solid content concentration of Comparative Sample A was 43.0 mass % and the acid value of solid content was 105. Also, the polystyrene-equivalent weight average molecular weight by GPC was 35,000.

Preparation of Photosensitive Resin Composition

Samples A, B, C and D and Comparative Sample A each was adjusted with PMA to a solid content concentration of 30 mass %. Furthermore, these resin solutions each was blended with trimethylolpropane triacrylate (TMP-A, trade name, produced by Kyoeisha Chemical Co., Ltd.) and a photopolymerization initiator to have a composition shown in Table 1. In this way, photosensitive resin compositions (Examples 5 to 8 and Comparative Example 2) were prepared.

TABLE 1

Composition of Various Photosensitive Resin Compositions

| Component Name | Example 5 | Example 6 | Example 7 | Example 8 | Comparative Example 2 |
|---|---|---|---|---|---|
| Radical polymerizable resin (solid content concentration: 30 mass %) | Sample A 100 parts by mass | Sample B 100 parts by mass | Sample C 100 parts by mass | Sample D 100 parts by mass | Comparative Sample A 100 parts by mass |
| Trimethylolpropane triacrylate | 15 parts by mass | 15 parts by mass | 15 parts by mass | 15 parts by mass | 15 parts by mass |
| Irgacure 907 | 2.5 parts by mass | 2.5 parts by mass | 2.5 parts by mass | 2.5 parts by mass | 2.5 parts by mass |
| EAB-F | 0.5 parts by mass | 0.5 parts by mass | 0.5 parts by mass | 0.5 parts by mass | 0.5 parts by mass |
| Evaluation of photosensitive resin composition | | | | | |
| Evaluation 1 of photosensitivity | 10 | 8 | 8 | 9 | 5 |
| Evaluation 2 of photosensitivity | 11 | 11 | 11 | 10 | 11 |

Irgacure 907: 2-Methyl-1-[4-(methylthio)phenyl]-2-morpholino-propan-1-one, produced by Ciba Specialty Chemicals Corp.
EAB-F: 4,4'-bis(N,N-diethylamino)benzophenone, produced by Hodogaya Kagaku K.K.

Evaluation of Photosensitive Resin Composition

Evaluation 1 of Photosensitivity

The photosensitive resin compositions and comparative photosensitive resin composition in Table 1 each was coated on a glass substrate in a size of 100×100×1 mm by a spin coater to a dry thickness of about 15 μm. Each coated substrate was dried by a hot-air circulating dryer under the conditions of 70° C. and 30 minutes to remove the solvent and after placing a 21-step tablet (produced by Hitachi Chemical Co., Ltd.) on each coating film, exposed by an exposure apparatus (Multilight ML-251A/B, trade name, manufactured by Ushio Inc.) having integrated therein an ultrahigh-pressure mercury lamp to give a dosage of 200 mJ/cm$^2$. The dosage of ultraviolet ray irradiated was measured by Unimeter UIT-150 (light-receiving part: UVD-S365). After the exposure, each coated substrate was developed with an aqueous 1% sodium carbonate solution at 30° C. for 1 minute, then washed with water and dried by an air gun. Thereafter, the step number where the coating film was completely remaining was read. A larger step number reveals higher photosensitivity. The results are shown in Table 1.

Evaluation 2 of Photosensitivity

The photosensitive resin compositions and comparative photosensitive resin composition in Table 1 each was coated on a glass substrate in a size of 100×100×1 mm by a spin coater to a dry thickness of about 15 μm. Each coated substrate was dried by a hot-air circulating dryer under the conditions of 70° C. and 30 minutes to remove the solvent. On each coating film after drying the solvent, 10 mass % of an aqueous polyvinyl alcohol solution was coated. Subsequently, each coated substrate was dried by a hot-air circulating dryer under the conditions of 70° C. and 30 minutes to remove water and after placing a 21-step tablet (produced by Hitachi Chemical Co., Ltd.) on each coating film, exposed by an exposure apparatus (Multilight ML-251A/B, trade name, manufactured by Ushio Inc.) having integrated therein an ultrahigh-pressure mercury lamp to give a dosage of 200 mJ/cm$^2$. After the exposure, each coated substrate was washed with water to remove the polyvinyl alcohol film and then developed for 1 minute by dipping it in an aqueous 1% sodium carbonate solution at 30° C., followed by washing with water and drying by an air gun. Thereafter, the step number where the coating film was completely remaining was read. A larger step number reveals higher photosensitivity. The results are shown in Table 1.

As seen from the results in Table 1, the radical polymerizable•curable resin composition containing a curable polymer compound having an allyl group and a fumaric acid monoester in the side chain of the present invention is prevented from radical polymerization inhibition due to oxygen, so that a polymer compound composition having excellent surface curability can be prepared. Furthermore, by virtue of a carboxyl group, excellent alkali developability is also obtained. On the other hand, the resin composition of Comparative Example 2 exhibits high sensitivity in the oxygen-blocked state (Evaluation 2), but when oxygen is present, the sensitivity is extremely decreased (Evaluation 1).

EFFECTS OF THE INVENTION

The photo-radical polymerizable•curable composition of the present invention can be suitably used in usage for resists such as etching resist, solder resist and color filter resist.

The invention claimed is:

1. A polymer compound having in the side chain thereof a structure represented by the following formula (1):

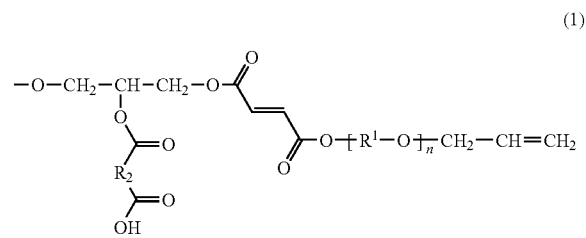

wherein $R^1$ each independently represents at least one or more organic residue selected from the group consisting of an alkylene group, a branched alkylene group, a cycloalkylene group, an aralkylene group and an arylene group, $R^2$ each independently represents at least one or more organic residue selected from the group consisting of an alkylene group, a branched alkylene group, an alkenylene group, a branched alkenylene group, a cycloalkylene group, a cycloalkenylene group and an arylene group, and n represents an integer of 0 to 20.

2. The polymer compound as described in claim 1, wherein the polymer compound has a main chain which is a (meth) acrylic acid ester copolymer.

3. The polymer compound as described in claim 1, wherein in formula (1), $R^1$ has a structure represented by the following formula:

$$—CH_2—CH_2—, \tag{3}$$

$$\begin{array}{c} —CH_2—CH—, \\ | \\ CH_3 \end{array} \text{ or} \tag{4}$$

$$\begin{array}{c} —CH—CH_2—. \\ | \\ CH_3 \end{array} \tag{5}$$

4. The polymer compound as described in claim 1, wherein $R^2$ has a structure represented by the following formula:

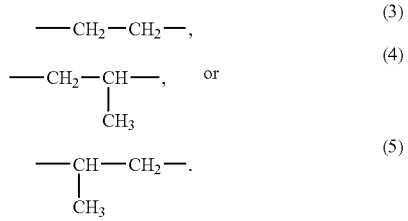

$$—CH_2—CH_2—. \tag{7}$$

5. A process for producing the polymer compound described in claim 1, comprising the following steps:

Production Step A1:
a production step of performing an addition reaction of adding to a polymer compound represented by the following formula (8):

$$R^4 \left[ \begin{array}{c} O \\ \diagdown \diagup \\ O \end{array} \right]_m \tag{8}$$

wherein $R^4$ represents a polymer compound residue, and m represents an integer of 2 or more, at least one or more compound represented by the following formula (9):

$$\text{HO} \underset{O}{\overset{O}{\diagdown}} \diagdown \diagup \overset{O}{\diagdown} O \text{—}\!\!\left[ R^1 \text{—} O \right]_n \!\!\text{—} CH_2 \text{—} CH = CH_2 \tag{9}$$

wherein $R^1$ each independently represents at least one or more organic residue selected from the group consisting of an alkylene group, a branched alkylene group, a cycloalkylene group, an aralkylene group and an arylene group, and n represents an integer of 0 to 20; and Production Step A2:
a production step of further adding to the polymer compound having a hydroxyl group obtained in Production Step A1, at least one or more polybasic acid anhydride represented by the following formula (10):

$$\begin{array}{c} O \\ \| \\ R^2 \diagup\!\!\!\diagdown O \\ \diagdown\!\!\!\diagup \\ \| \\ O \end{array} \tag{10}$$

wherein $R^2$ each independently represents at least one or more organic residue selected from the group consisting of an alkylene group, a branched alkylene group, an alkenylene group, a branched alkenylene group, a cycloalkylene group, a cycloalkenylene group and an arylene group, to obtain the polymer compound described in claim 1.

6. The process as described in claim 5, wherein in formula (9), $R^1$ has a structure represented by the following formula:

$$—CH_2—CH_2—, \tag{3}$$

$$\begin{array}{c} —CH_2—CH—, \\ | \\ CH_3 \end{array} \text{ or} \tag{4}$$

$$\begin{array}{c} —CH—CH_2—. \\ | \\ CH_3 \end{array} \tag{5}$$

7. The process as described in claim 5, wherein in formula (10), $R^2$ has at least one structure represented by the following formula:

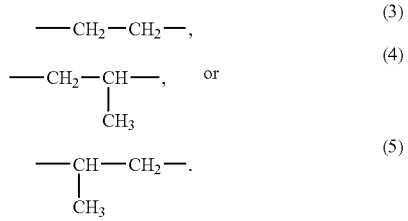

$$—CH_2—CH_2—. \tag{7}$$

8. The process as described in claim 5, wherein the addition reaction of Production Step A1 is performed in the presence of a catalyst.

9. The process as described in claim 8, wherein the catalyst contains at least one or more catalyst selected from the group consisting of a metal halide, a tertiary amine, a pyridine-based compound, a pyridinium salt, a quaternary ammonium salt, a phosphine-based compound and a phosphonium salt.

10. The process as described in claim 9, wherein the catalyst contains at least one or more catalyst selected from the group consisting of benzyltrimethylammonium chloride, benzyltriethylammonium chloride, tetrabutylammonium bromide, triphenylphosphine, ethyltriphenylphosphonium bromide, tetraphenylphosphonium bromide and benzyltriphenylphosphonium chloride.

11. A radical polymerizable·curable composition comprising the polymer compound described in claim 1.

12. The composition as described in claim 11, which comprises from 1 to 99 mass % of the polymer compound and from 1 to 99 mass % of an ethylenically unsaturated compound.

13. A radical polymerizable·curable composition comprising from 0.1 to 40 parts by mass of a radical polymerization initiator per 100 parts by mass of the composition described in claim 11.

14. The composition as described in claim 13, wherein the radical polymerization initiator is a photo-radical polymerization initiator.

15. A photocured product having a pattern obtained by coating the composition described in claim 14 on a substrate, exposing and curing the composition through a photomask, and washing out the uncured portion with an aqueous alkali solution.

16. A polymer compound having in the side chain thereof both a structure represented by the following formula (1):

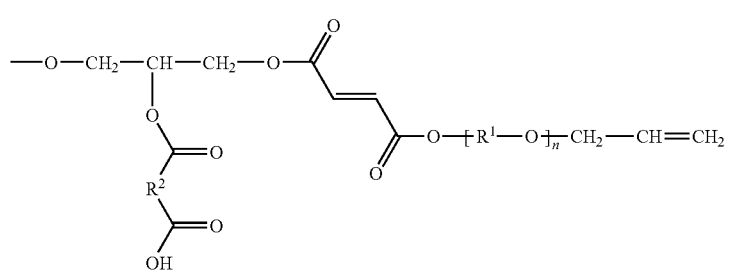

wherein $R^1$ each independently represents at least one or more organic residue selected from the group consisting of an alkylene group, a branched alkylene group, a cycloalkylene group, an aralkylene group and an arylene group, $R^2$ each independently represents at least one or more organic residue selected from the group consisting of an alkylene group, a branched alkylene group, an alkenylene group, a branched alkenylene group, a cycloalkylene group, a cycloalkenylene group and an arylene group, and n represents an integer of 0 to 20 and a structure represented by the following formula (2):

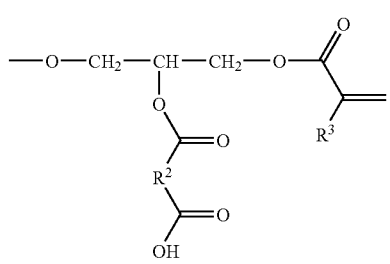

wherein $R^2$ each independently represents at least one or more organic residue selected from the group consisting of an alkylene group, a branched alkylene group, an alkenylene group, a branched alkenylene group, a cycloalkylene group, a cycloalkenylene group and an arylene group, and $R^3$ represents a hydrogen atom or a methyl group.

17. The polymer compound as described in claim 16, wherein the polymer compound has a main chain which is a (meth)acrylic acid ester copolymer.

18. The polymer compound as described in claim 16, wherein in formula (1), $R^1$ has a structure represented by the following formula:

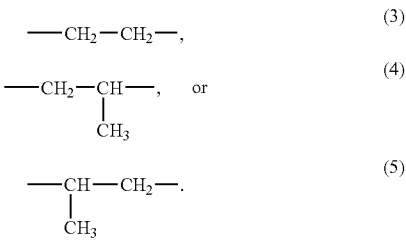

19. The polymer compound as described in claim 16, wherein in formula (1) or (2), $R^2$ has a structure represented by the following formula:

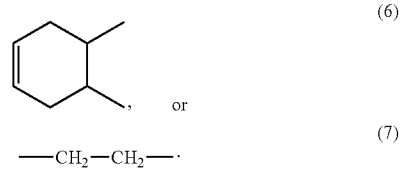

20. A process for producing the polymer compound described in claim 16, comprising the following production steps:

Production Step B 1:
a production step of performing an addition reaction of adding to a polymer compound represented by the following formula (8):

wherein $R^4$ represents a polymer compound residue, and m represents an integer of 2 or more, at least one or more compound represented by the following formula (9):

(9)

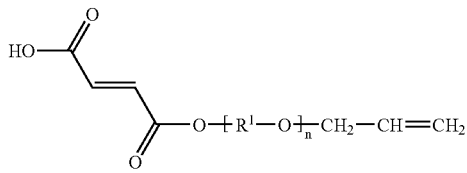

wherein $R^1$ each independently represents at least one or more organic residue selected from the group consisting of an alkylene group, a branched alkylene group, a cycloalkylene group, an aralkylene group and an arylene group, and n represents an integer of 0 to 20 and at least one or more compound represented by the following formula (11):

(11)

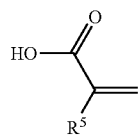

wherein $R^5$ represents a hydrogen atom or a methyl group; and

Production Step B2:
a production step of further adding to the polymer compound having a hydroxyl group obtained in Production Step B 1, at least one or more polybasic acid anhydride represented by the following formula (10):

(10)

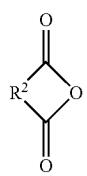

wherein $R^2$ each independently represents at least one or more organic residue selected from the group consisting of an alkylene group, a branched alkylene group, an alkenylene group, a branched alkenylene group, a cycloalkylene group, a cycloalkenylene group and an arylene group to obtain the polymer compound described in claim 16.

21. The process as described in claim 20, wherein in formula (9), $R^1$ has a structure represented by the following formula:

(3)

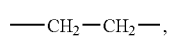

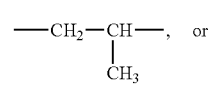
(4)

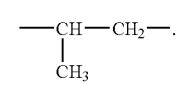
(5)

22. The process as described in claim 20, wherein in formula (10), $R^2$ has at least one structure represented by the following formula:

(6)

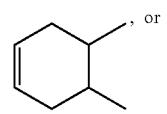

(7)

23. The process as described in claim 20, wherein the addition reaction of Production Step B 1 is performed in the presence of a catalyst.

24. The process as described in claim 23, wherein the catalyst contains at least one or more catalyst selected from the group consisting of a metal halide, a tertiary amine, a pyridine-based compound, a pyridinium salt, a quaternary ammonium salt, a phosphine-based compound and a phosphonium salt.

25. The process as described in claim 24, wherein the catalyst contains at least one or more catalyst selected from the group consisting of benzyltrimethylammonium chloride, benzyltriethylammonium chloride, tetrabutylammonium bromide, triphenylphosphine, ethyltriphenylphosphonium bromide, tetraphenylphosphonium bromide and benzyltriphenylphosphonium chloride.

26. A radical polymerizable•curable composition comprising the polymer compound described in claim 16.

27. The composition as described in claim 26, which comprises from 1 to 99 mass % of the polymer compound and from 1 to 99 mass % of an ethylenically unsaturated compound.

28. A radical polymerizable•curable composition comprising from 0.1 to 40 parts by mass of a radical polymerization initiator per 100 parts by mass of the composition described in claim 26.

29. The composition as described in claim 28, wherein the radical polymerization initiator is a photo-radical polymerization initiator.

30. A photocured product having a pattern obtained by coating the composition described in claim 29 on a substrate, exposing and curing the composition through a photomask, and washing out the uncured portion with an aqueous alkali solution.

\* \* \* \* \*